(12) United States Patent
Neukirch

(10) Patent No.: US 7,619,227 B2
(45) Date of Patent: Nov. 17, 2009

(54) METHOD OF REDUCING RADIATION-INDUCED DAMAGE IN FUSED SILICA AND ARTICLES HAVING SUCH REDUCTION

(75) Inventor: Ulrich Wilhelm Heinz Neukirch, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 377 days.

(21) Appl. No.: 11/710,303

(22) Filed: Feb. 23, 2007

(65) Prior Publication Data

US 2008/0203326 A1    Aug. 28, 2008

(51) Int. Cl.
*G02B 1/12* (2006.01)
(52) U.S. Cl. ............ 250/492.2; 250/492.1; 250/504 R; 65/28; 359/350; 359/355; 359/356
(58) Field of Classification Search .......... 250/492.2, 250/491.1, 493.1, 504 R, 492.1, 492.21, 492.22, 250/494.1, 495.1; 359/196.1, 201.1, 350, 359/354, 355, 356, 642, 655; 362/157, 167, 362/169, 257, 268, 335; 501/53, 54, 55; 65/17.1, 17.3, 28
See application file for complete search history.

(56) References Cited

U.S. PATENT DOCUMENTS 4,641,033 A *  2/1987  Petelin et al. ............ 250/492.1
5,896,222 A *  4/1999  Rosplock et al. ............ 359/355
2006/0107693 A1*  5/2006  Trommer et al. ............ 65/17.4
2006/0246694 A1*  11/2006  Talwar et al. ............... 438/487
2007/0075276 A1*  4/2007  Nolscher et al. ......... 250/504 R
2007/0294053 A1*  12/2007  Majima et al. .............. 702/185

FOREIGN PATENT DOCUMENTS

WO   WO2006/040184    4/2006
WO   WO2006/045748    5/2006

OTHER PUBLICATIONS

"Modification of vacuum-ultraviolet absorption of SiOH groups in $SiO_2$ glass with temperature, $F_2$ laser radiation, and H-D isotype exchange," Koichi Kajihara, Masahiro Hirano, Linards Skuja, Hideo Hosono, Journal of Non-Crystalline Solids, 352 (2006) 2307-2310.
"Thermal annealing of deep ultraviolet (193 nm) induced compaction in fused silica," Fan Piao, William G. Oldham, Eugene E. Haller, J. Vac. Sci. Technol. B 16(6), Nov./Dec. 1998, 3419-3421.

* cited by examiner

*Primary Examiner*—Jack I Berman
*Assistant Examiner*—Nicole Ippolito Rausch
(74) *Attorney, Agent, or Firm*—Robert P. Santandrea

(57) ABSTRACT

A method of repairing radiation-induced damage and reducing accumulated laser-induced wavefront distortion and polarization-induced birefringence in a fused silica article, such as a lens in a DUV optical system, prisms, filters, photomasks, reflectors, etalon plates, and windows. The distortion is reduced by irradiating the fused silica article with an irradiation source, such as an infrared laser. The radiation causes localized heating which repairs at least a portion of the fused silica lens. A fused silica lens that has been treated by the method and a lithographic system are also described.

27 Claims, 7 Drawing Sheets

METHOD OF REDUCING RADIATION-INDUCED DAMAGE IN FUSED SILICA AND ARTICLES HAVING SUCH REDUCTION

BACKGROUND OF INVENTION

The invention relates to fused silica. More particularly, the invention relates to a method of reducing radiation-induced damage in fused silica articles, such as lenses. Even more particularly, the invention relates to a method of using radiation, such as infrared radiation, to reduce such radiation-induced damage in fused silica articles.

Fused silica is used in optical members such as lenses, prisms, filters, photomasks, reflectors, etalon plates, and windows. Many of these optical members are used in various apparatus employed in environments where they are exposed to ultraviolet light such as, for example, an excimer laser beam or some other ultraviolet laser beam, having a wavelength of about 360 nm or less. The optical members are incorporated into a variety of instruments, including lithographic laser exposure equipment for producing highly integrated circuits, laser fabrication equipment, medical equipment, nuclear fusion equipment, or some other apparatus which uses a high-power ultraviolet laser beam.

Laser technology has advanced into the short wavelength, high energy ultraviolet spectral region, the effect of which is an increase in the frequency (decrease in wavelength) of light produced by lasers. Of particular interest are short wavelength lasers operating in the UV, deep UV (DUV), and vacuum UV wavelength ranges. Such lasers include, but are not limited to, those operating at about 248 nm, 193 nm, 157 nm, and even shorter wavelengths.

Excimer laser systems are widely used in microlithography applications. The short wavelength of the excimer laser enables the preparation of circuits having decreased feature sizes by allowing for increased feature resolution and thus line densities in the manufacturing of integrated circuits and microchips, thus enabling the manufacture of circuits having decreased feature sizes.

A direct physical consequence of shorter radiation wavelengths (and higher frequencies) is higher photon energies. In optical systems such as those mentioned above, fused silica optics are exposed to high irradiation levels for prolonged periods of time. Such high radiation levels may result in the degradation of the optical properties of the optical members. Such laser induced degradation adversely affects the optical properties and performance of the fused silica optics by decreasing light transmission levels, discoloring the glass, altering the index of refraction, altering the density, and increasing absorption levels of the glass. Changes in density and index of refraction cause wavefront distortion and polarization-induced birefringence (also referred herein as "PIB"), which slowly increase over the course of exposure. Such wavefront distortion and PIB reduce the useful lifetime of the fused silica optics and thus limit the optical performance of the system.

One current approach to this problem is to identify silica compositions that are resistant to DUV radiation-induced damage. Here, manufacturing parameters, such as the concentration of water vapor utilized, are varied, or various dopants are added to the base silica composition to increase the resistance of the silica glass to radiation-induced damage. Although previous techniques have been effective, there is a continuing search for additional improvements that are directed at improving the resistance of fused silica to radiation-induced damage and mitigating such damage.

Another approach is to develop processes that reduce the laser-induced damage. Thermal treatment in the range of 125° C. to 400° C., as described by Piao et al. ("Thermal Annealing of Deep Ultraviolet (193 nm) Induced Compaction in Fused Silica," J. Vac. Sci. Technol. vol. B16(6), 1998, p. 3419), for example, is known to reduce wavefront distortion after exposure to DUV light. However, the use of high temperatures precludes such heat treatments in complex lithography systems.

Presently, the ability to increase or improve the resistance of fused silica to DUV radiation-induced damage or repair such damage is limited by either composition or processing restraints. Therefore, what is needed is a method of repairing such radiation-induced damage and the wavefront distortion and polarization-induced birefringence resulting from such damage. What is also needed is a fused silica article, such as a lens, having reduced wavefront distortion and polarization-induced birefringence.

SUMMARY OF INVENTION

The present invention meets these and other needs by providing a method of repairing radiation-induced damage and reducing accumulated laser-induced wavefront distortion in a fused silica article, such as a lens in a DUV optical system, prisms, filters, photomasks, reflectors, etalon plates, windows, and the like. The distortion is reduced by irradiating the fused silica article with a radiation source, such as an infrared laser. The radiation causes localized heating, which repairs at least a portion of the fused silica lens. A fused silica lens that has been treated by the method and a lithographic system are also described.

Accordingly, one aspect of the invention is to provide a lithographic system. The lithographic system comprises: a deep ultraviolet laser; at least one fused silica lens optically coupled to the deep ultraviolet laser, wherein the at least one fused silica lens is exposed to deep ultraviolet radiation produced by the deep ultraviolet laser; and a radiation source optically coupled to the at least one fused silica lens, wherein the radiation source is capable of providing localized heating to the at least one fused silica lens, and wherein the localized heating repairs radiation-induced damage caused by the deep ultraviolet radiation in the at least one fused silica lens.

A second aspect of the invention is to provide a fused silica lens having a region in which radiation-induced damage caused by deep ultraviolet laser radiation has been repaired by irradiating the region with an infrared laser.

A third aspect of the invention is to provide a lithographic system. The lithographic system comprises: a deep ultraviolet laser; at least one fused silica lens optically coupled to the deep ultraviolet laser, wherein the at least one fused silica lens is exposed to deep ultraviolet radiation produced by the deep ultraviolet laser; and an infrared laser optically coupled to the at least one fused silica lens, wherein the infrared laser is capable of providing localized heating to the at least one fused silica lens, and wherein the localized heating repairs radiation-induced damage caused by the deep ultraviolet radiation in the at least one fused silica lens.

A fourth aspect of the invention is to provide a method of repairing a fused silica article having radiation-induced damage. The method comprises the steps of: providing the fused silica article, the fused silica article having a damaged region, wherein the damaged region contains radiation-induced damage; providing a radiation source optically coupled to the at least one fused silica lens, wherein the radiation source is capable of providing localized heating to the at least one fused silica lens, and wherein the localized heating repairs radiation-induced damage caused by the deep ultraviolet radiation in the at least one fused silica lens; optically coupling the radiation source to the fused silica article; and irradiating the damaged region with the radiation source, wherein irradiating the damaged region locally heats the damaged region and repairs at least a portion of the radiation-induced damage.

A fifth aspect of the invention is to provide a method of reducing wavefront distortion and polarization-induced birefringence in a fused silica lens. The method comprises the steps of: providing the fused silica lens, the fused silica lens having a damaged region having radiation-induced damage caused by ultraviolet laser radiation, and wherein the radiation-induced damage causes wavefront distortion and polarization-induced birefringence in the fused silica lens; a radiation source optically coupled to the at least one fused silica lens, wherein the radiation source is capable of providing localized heating to the at least one fused silica lens, and wherein the localized heating repairs radiation-induced damage caused by the deep ultraviolet radiation in the at least one fused silica lens; optically coupling the radiation source to the fused silica lens; and irradiating the damaged region with the radiation source, wherein irradiating the damaged region locally heats the damaged region and repairs at least a portion of the radiation-induced damage, and wherein repairing at least a portion of the radiation-induced damage reduces the wavefront distortion and polarization birefringence in the fused silica lens.

These and other aspects, advantages, and salient features of the present invention will become apparent from the following detailed description, the accompanying drawings, and the appended claims.

DETAILED DESCRIPTION

Figure 1:
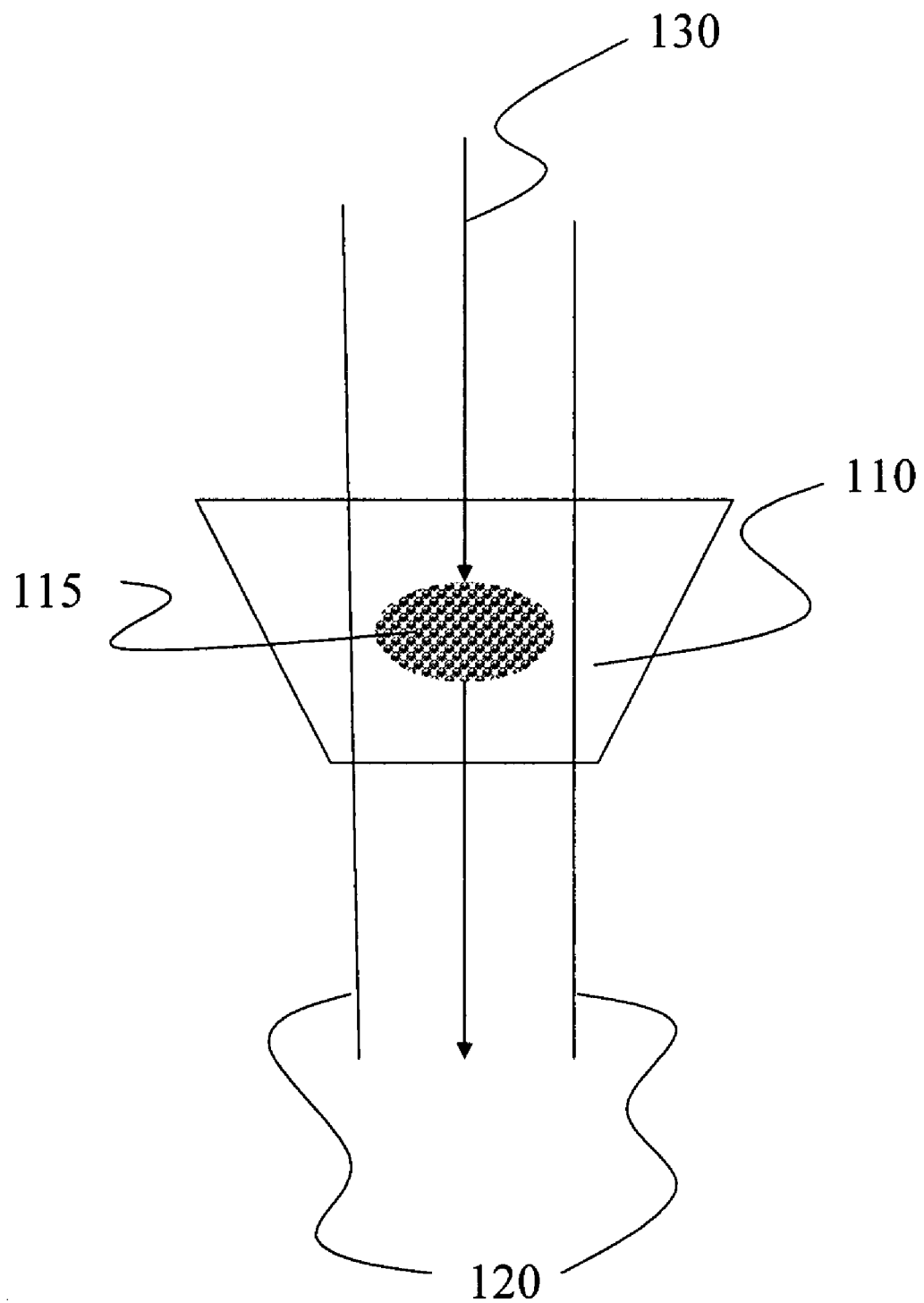
FIG. 1 is a schematic representation of the interaction between DUV light and a fused silica lens.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

Referring to the drawings in general and to FIG. 1 in particular, it will be understood that the illustrations are for the purpose of describing particular embodiments of the invention and are not intended to limit the invention thereto.

Lithographic techniques that are currently used to pattern semiconductor layers typically use 193 nm DUV laser light to write patterns. The DUV light permanently damages the fused silica lenses of the lithographic scanner/stepper system (also referred to herein as a "scanner/stepper system" or a "lithographic system"), as evidenced by changes in physical properties, such as decreased light transmission levels, discoloration, changes in the index of refraction, altered the density, and increased absorption levels of the lenses. Changes in density and index of refraction due to radiation damage cause wavefront distortion polarization-induced birefringence (also referred to herein as "PIB"), which slowly increase over the course of exposure. One measure of such distortion is known as "wavefront error." A wavefront is a two-dimensional map of the phase of an optical field. An ideal optical system projects a given phase map without any change other than re-sizing (i.e., demagnification in a lithography system) from the object plane to the image plane. Any deviation from the original map would be considered a wavefront error. Wavefront distortion/error is usually quantified in units of length or fractions of wavelength. Such distortion slowly increases over the course of exposure of the fused silica lenses to the DUV light and thus continuously reduces the useful lifetime of the fused silica lenses and the overall optical performance of the lithographic system. Eventually, the performance of the lithographic system and fused silica lenses fall below a desired standard, and the system and lenses are no longer usable.

While thermal treatment of fused silica is known to reduce wavefront distortion in fused silica that has been exposed to DUV radiation, exposure to high temperatures may cause damage to other components of the lithographic system. It is also desirable not to disassemble complex lithographic scanner/stepper systems. Any repair to the fused silica lenses of the system should therefore be done in situ.

Turning to FIG. 1, the interaction between DUV light and a fused silica lens of a lithographic system is schematically shown. DUV light 130 from a DUV laser (not shown) travels along an optical path 120 through a fused silica lens 110, causing damage in a region (also referred to herein as a "damaged region") 115 of fused silica lens 110 along optical path 120.

One consequence of DUV radiation-induced damage is polarization-induced birefringence. As used herein, the term polarization-induced birefringence refers to the numerical difference between the peak measured birefringence level in the center portion of the uniformly exposed area of the fused silica glass after a certain time interval or number of laser pulses (if a pulsed laser beam is used) and the initial birefringence of the glass before exposure to radiation. The polarization-induced birefringence level of a fused silica sample may be measured by directing a linearly polarized pulsed laser beam having a wavelength of approximately 193 nm and a beam diameter of about 3 mm with a given fluence and pulse length to a fixed area of the fused silica sample. The measured birefringence at the center portion of the exposed area is measured after a certain number of pulses. The polarization-induced birefringence value is then calculated by subtracting the initial birefringence of the glass from the measured center birefringence.

Figure 2:
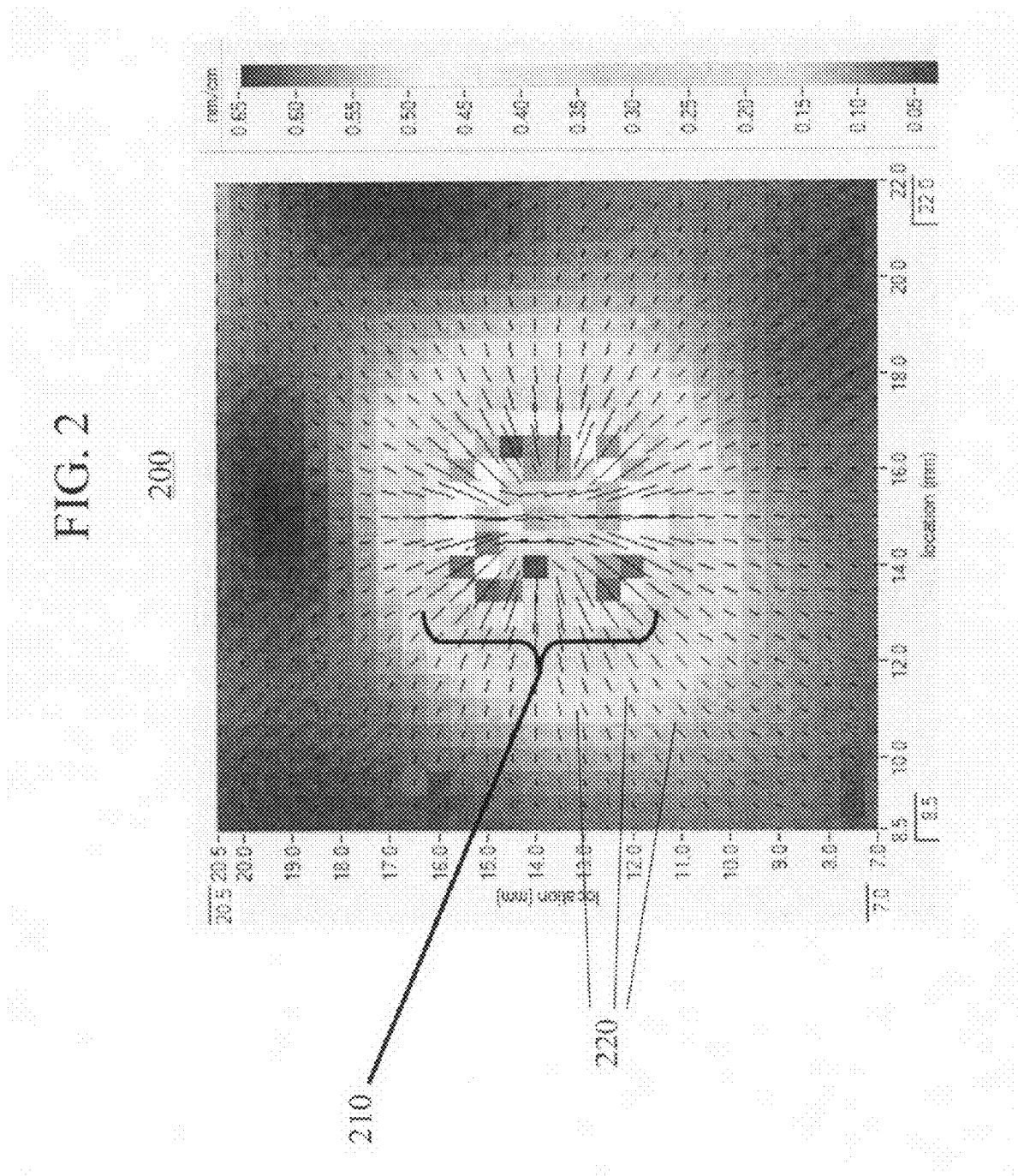
FIG. 2 is a two-dimensional birefringence map of a fused silica sample that has been exposed to a linearly polarized DUV light beam.

An example of PIB is shown in FIG. 2, which is a two-dimensional birefringence map 200 of a fused silica sample that has been exposed to a linearly polarized DUV light beam. The birefringence magnitude is grey-scale coded, as shown on the right side of the map. The spot 210 is induced birefringence in and around laser damaged area, and the black lines 220 indicate the direction of the slow birefringence axis of the fused silica at particular locations.

Figure 3:
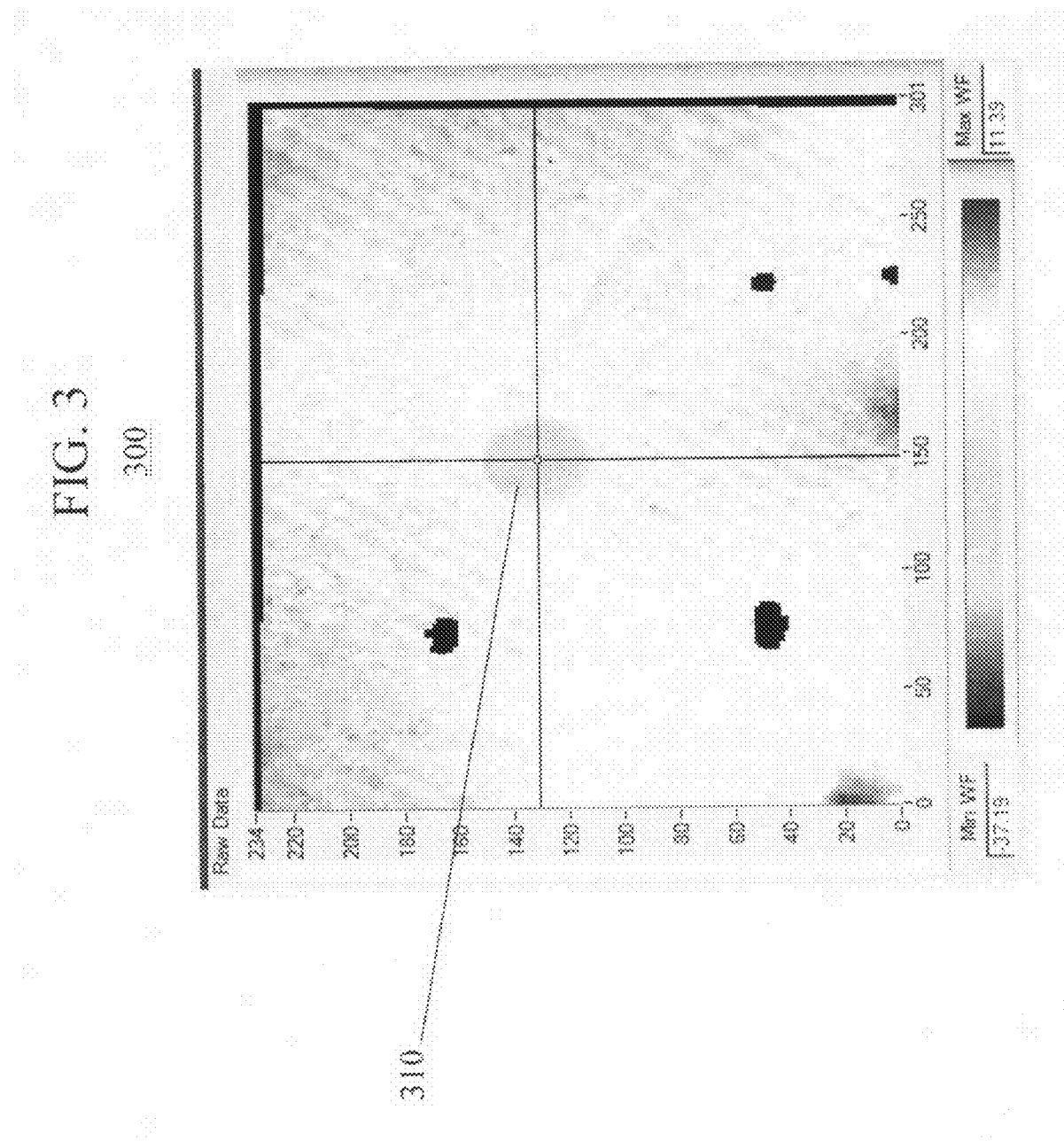
FIG. 3 is a wavefront map showing the effect of DUV radiation-induced damage on wavefront distortion in a fused silica sample.

The effect of DUV radiation-induced damage on wavefront distortion in a fused silica sample is shown in wavefront map 300 (FIG. 3). Spot 310 in FIG. 3 is a laser-damaged area that exhibits a longer optical path length and a resulting increase in index of refraction.

The invention provides a method of repairing radiation-induced damage in a fused silica article and a method of reducing wavefront distortion and polarization-induced birefringence in a fused silica lens. In one particular embodiment, the method is used to repair damaged region 115 caused by DUV light 130 in fused silica lens 110, and thus improve optical performance of fused silica lens 110. Whereas portions of the following description describe these methods as applied to a fused silica lens, it is understood that these methods are equally applicable for repairing other fused silica articles having such damage. Such fused silica articles include, but are not limited to, prisms, filters, photomasks, reflectors, etalon plates, windows, and the like. Moreover, such damage may be caused by radiation sources other than DUV light such as electron beam radiation, gamma radiation, and the like.

A fused silica article having a damaged region is first provided. In one embodiment, the fused silica article is a fused silica lens 110 (FIG. 1) that is incorporated in a lithographic scanner/stepper system. In another embodiment, the fused silica article may also form a portion of—or be included in—other types of optical systems known in the art such as, but not limited to, laser fabrication equipment, medical equipment, nuclear fusion equipment, and the like. In a third embodiment, the fused silica article is an individual or free-standing article such as, for example, a lens.

A radiation source is then provided and optically coupled to the fused silica article. In one embodiment, the radiation source is an infrared laser such as, but not limited to, a titanium-sapphire optical parametric amplifier. Whereas the following description describes an infrared laser as the radiation source, it is understood that other radiation sources known in the art may be used for repairing fused silica articles having such damage. The infrared laser may be coupled to the fused silica article by mirrors, lenses, optical fibers, other means known in the art, or any combination thereof. The damaged region is then irradiated with the infrared laser. At least a portion of the damaged region is repaired by such irradiation. The infrared laser deposits energy in the damaged region of the fused silica. The energy triggers a healing process—on a small scale—similar to that observed for large-scale thermal annealing. The localized heating occurs on an atomic scale; as irradiation excites chemical bonds, thus causing vibration of the bonds, generating heat. The localized heating effect of the absorption of a single photon can be estimated using the bulk properties, such as heat capacity and density, of fused silica. Based on such properties, the absorption of a single infrared photon could raise the local non-equilibrium temperature of a unit cell (0.5 nm length) of fused silica by as much as 500° C. Unlike large-scale thermal annealing, however, the localized heating by the infrared laser does not raise the average temperature of the fused silica article to levels that would adversely affect optical performance and alignment, as well as the performance of non-optical components for systems—such as, for example, lithographic systems—beyond acceptable levels.

Figure 4:
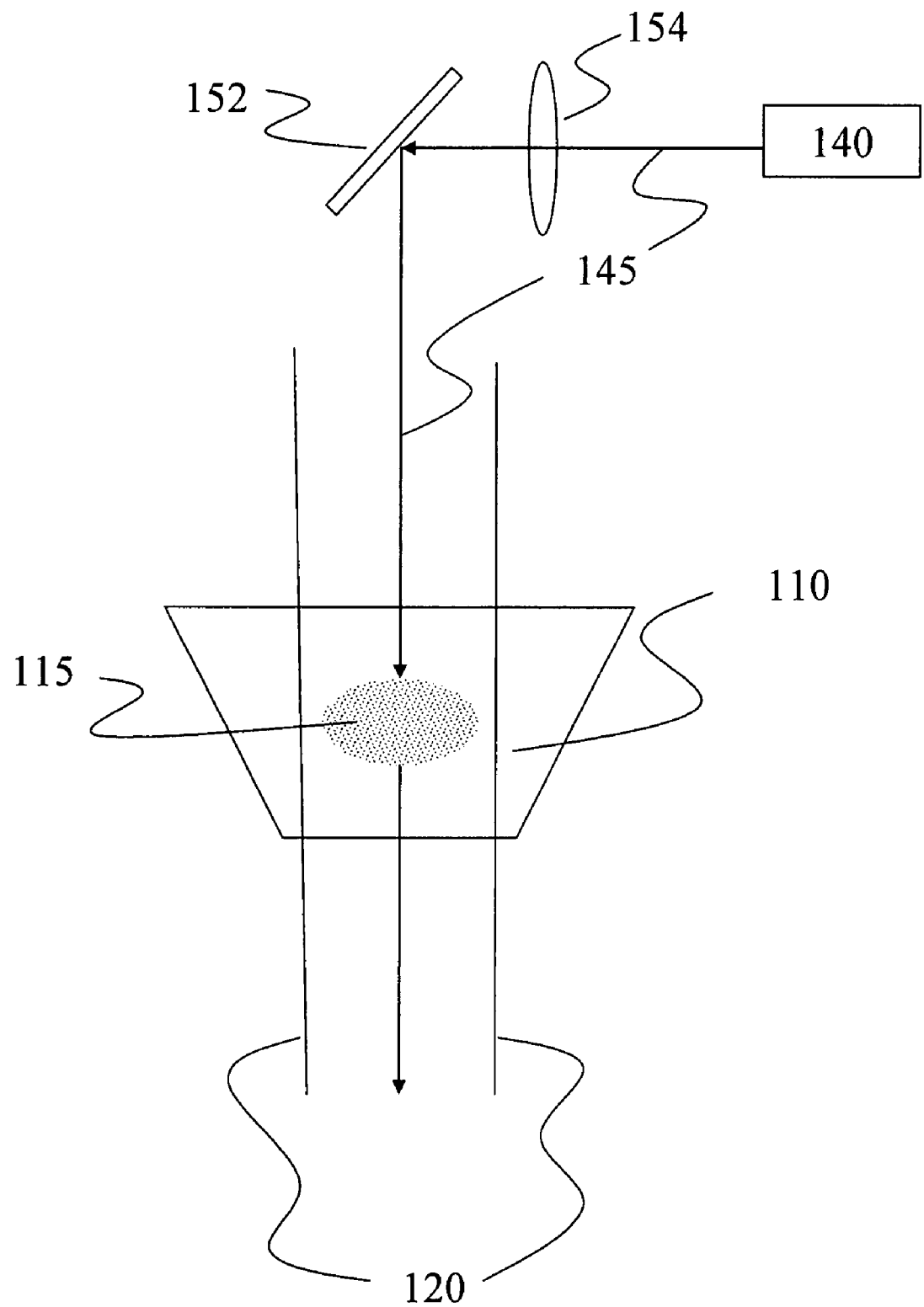
FIG. 4 is a schematic representation of an infrared laser optically coupled to an optical path through a fused silica lens.

In one embodiment, a damaged region is disposed within an optical path. In this instance, the infrared laser is optically coupled with the fused silica article such that the infrared laser beam travels along the optical path and irradiates the damaged region. An example of such optical coupling is schematically shown in FIG. 4, in which an infrared laser beam 145 from infrared laser 140 is directed into optical path 120 by lens 154 and mirror 152. Alternatively, at least one optical fiber (not shown) may be used to couple the infrared laser beam to the fused silica article through or along the optical path, or via another route. Whereas a single mirror and lens are shown in FIG. 4, it is understood that any combination of lenses, mirrors, optical fibers, and other components that are known in the art may be used to couple infrared laser beam 145 to the fused silica article through or along optical path 120. Infrared laser beam 145 then irradiates damaged region 115, which is located in fused silica lens 110 and within optical path 120, thereby repairing at least a portion of the radiation-induced damage in fused silica lens 110. Repair of damaged portion 115 of fused silica lens 110 results in a corresponding reduction in wavefront distortion and PIB.

Figure 5:
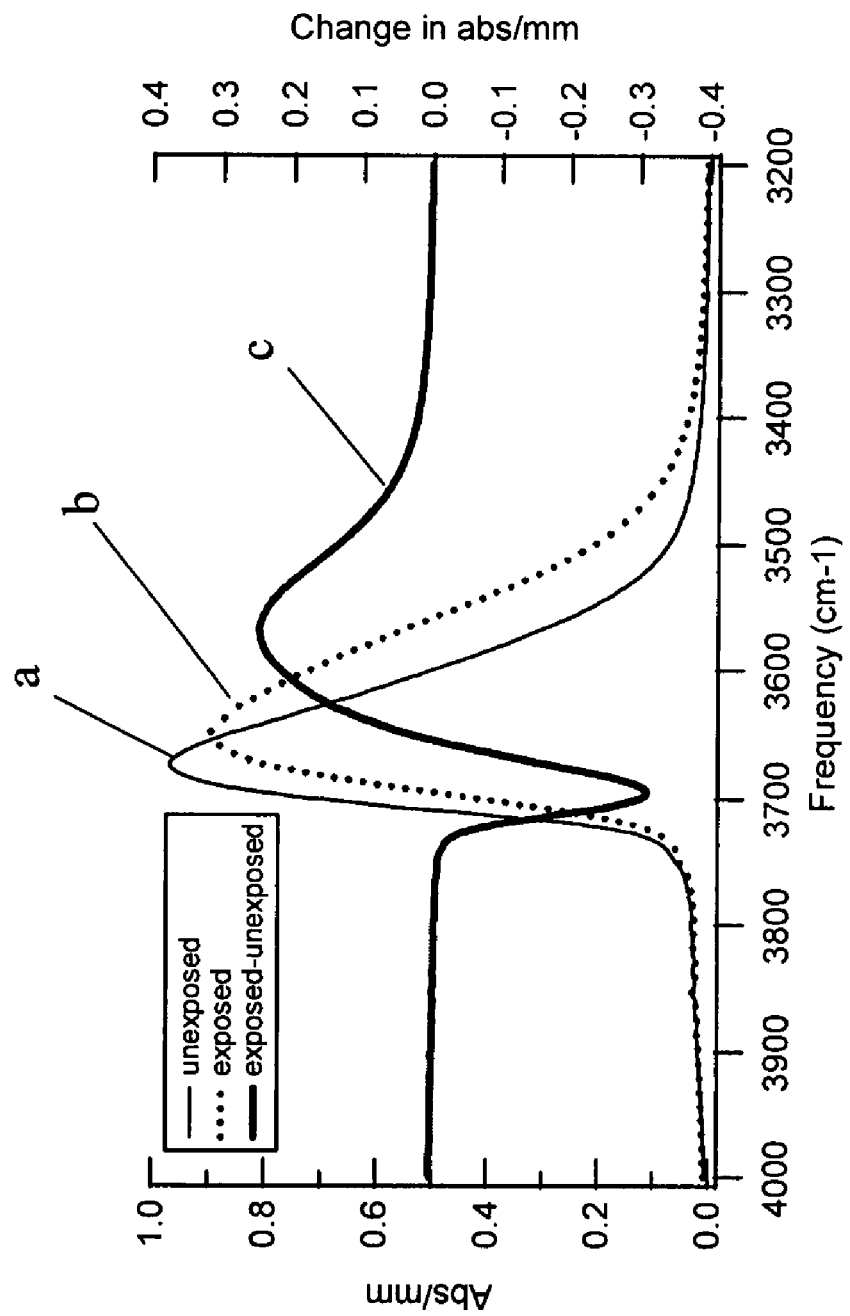
FIG. 5 is a plot of the infrared absorption of fused silica in the range of 4000 cm$^{-1}$ to 3200 cm$^{-1}$ for: (a) fused silica that has not been exposed to DUV light; (b) fused silica exposed to 157 nm DUV light; and (c) the difference in absorption between exposed fused silica (b) and unexposed fused silica (c)

In one embodiment, the infrared laser is tuned to the OH-related absorption band. Infrared absorption spectra in the range of 4000 cm$^{-1}$ to 3200 cm$^{-1}$ for fused silica are shown in FIG. 5. The spectra shown in FIG. 5 include: (a) fused silica that has not been exposed to DUV light; (b) fused silica exposed to 157 nm DUV light; and (c) the difference in absorption between the exposed and unexposed fused silica are shown in FIG. 5. Given the OH-related absorption shown in FIG. 5, it is expected that laser light having a frequency in a range from about 3700 cm$^{-1}$ to about 3400 cm$^{-1}$ would be partially absorbed by OH-containing fused silica and thus heat the fused silica. This in turn would repair at least a portion of the radiation damaged area and thus effectively reduce wavefront distortion (and wavefront error) and PIB in the fused silica article.

As can be seen in FIG. 5, the OH-related absorption peak observed for exposed fused silica is shifted from the OH peak for unexposed fused silica. The absorption for exposed fused silica is greater in the range from about 3650 cm$^{-1}$ to about 3400 cm$^{-1}$. Thus, the infrared laser may be tuned at, for example, about 3600 cm$^{-1}$, to be selectively absorbed at damaged sites within the fused silica structure while limiting absorption of the infrared laser radiation at undamaged sites.

The damaged region of the fused silica article may be irradiated with the infrared laser for a time period that is sufficient to reduce either radiation-induced damage or the resulting wavefront distortion and polarization-induced birefringence in the fused silica lens to a level or value that is less than a predetermined—or threshold—level or value. The actual irradiation time and threshold values of wavelength distortion and PIB depend upon empirical factors such as, for example, the nature of the fused silica article, the power of the laser beam, and the performance requirements of both the fused silica article and the optical system in which it is used. As such, it is within the knowledge of one skilled in the art to determine the irradiation time and threshold value in each instance.

The invention also provides a lithographic scanner/stepper system. The lithographic system comprises a deep ultraviolet laser; at least one fused silica lens optically coupled to the deep ultraviolet laser, wherein the at least one fused silica lens is exposed to deep ultraviolet radiation produced by the deep ultraviolet laser; and a radiation source optically coupled to the at least one fused silica lens. The radiation source is capable of providing localized heating to the at least one fused silica lens. The localized heating repairs radiation-induced damage caused by the deep ultraviolet radiation in the at least one fused silica lens. In one embodiment, the radiation source is an infrared laser that is optically coupled to the at least one fused silica lens. Whereas the following description describes an infrared laser as the radiation source, it is understood that other radiation sources known in the art may be used for repairing fused silica articles having such damage.

The lithographic system further comprises those components found in lithographic systems that are used to pattern semiconductor wafers. Such components and systems are well known in the art. Non-limiting examples of such systems include the ASML 5500/950B Lithography System of the Triangle National Lithography Center, and are described in WO 2006/040184 A3, entitled "Illumination System for a Microlithographic Projection Exposure Apparatus;" and WO 2006/045748 A3, entitled "Projection Exposure Apparatus for Microlithography." The lithographic system of the present invention includes a stepper/scanner system such as, but not limited to, those systems mentioned above. Such systems are adapted to include an infrared laser that is optically coupled to at least one lens. The DUV radiation is typically produced by an excimer laser and has a wavelength of less than about 300 nm. Typical DUV wavelengths used in such systems are 248 nm, 193 nm, and 157 nm. In one embodiment, the lithographic system is an immersion system in which at least one lens element is allowed to contact a liquid.

Figure 6:
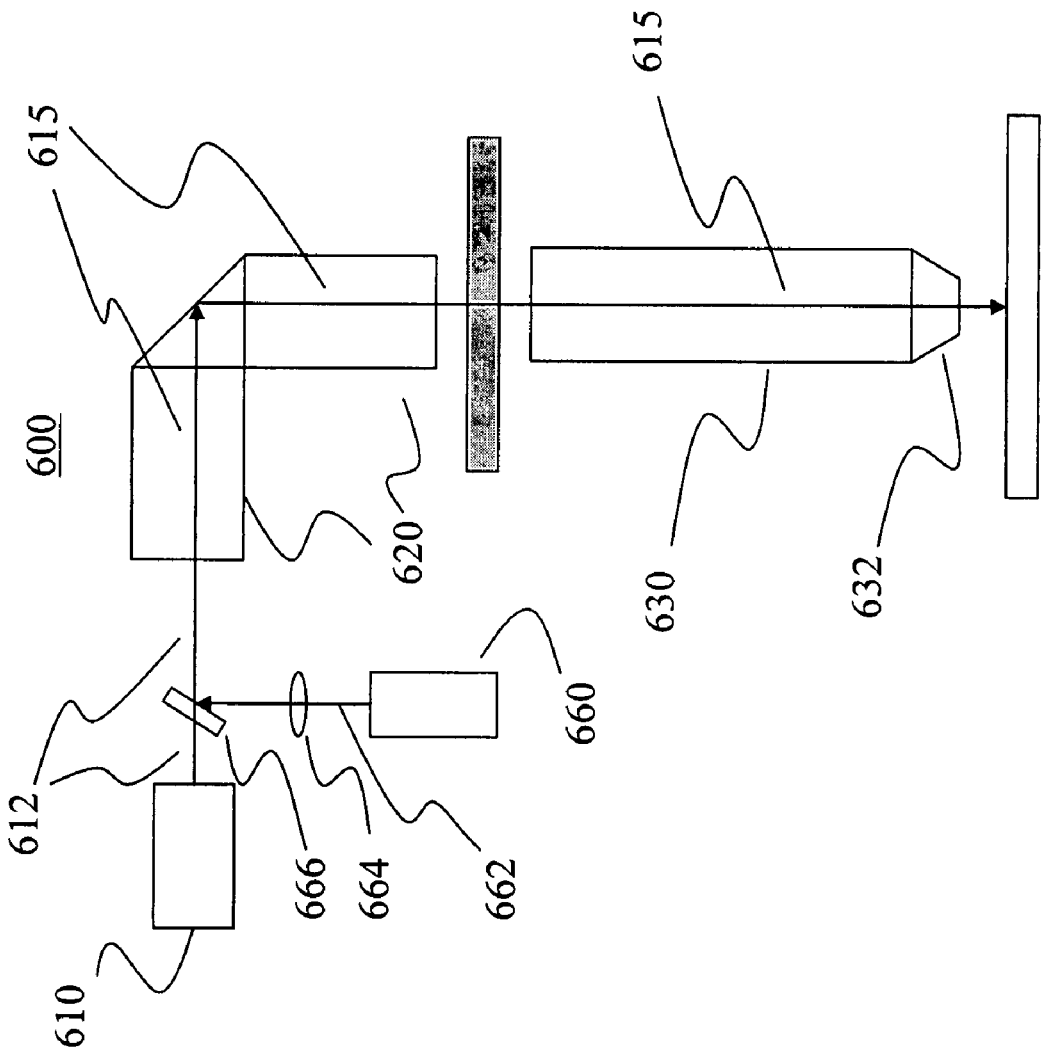
FIG. 6 is a schematic representation of one embodiment of a lithographic system.
Figure 7:
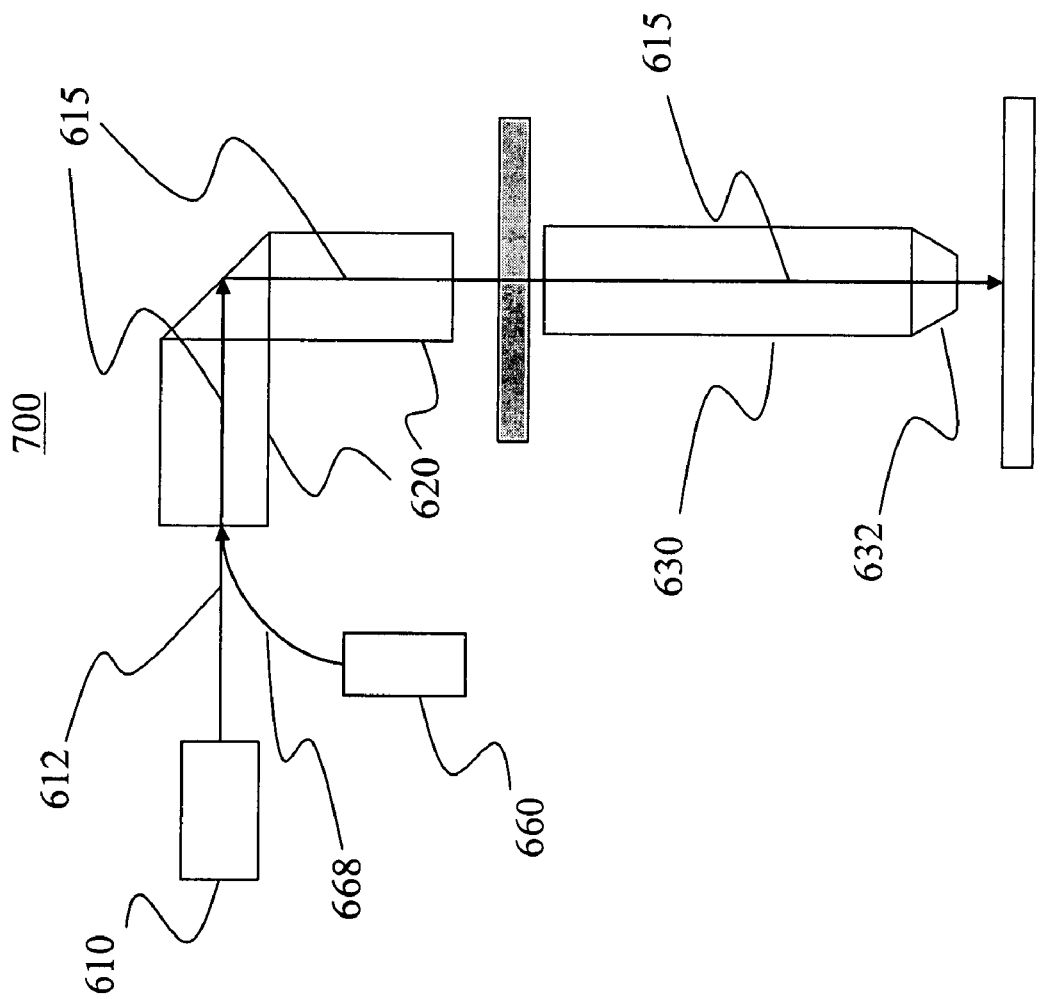
FIG. 7 is a schematic representation of a second embodiment of a lithographic system.

The infrared laser may be optically coupled to the at least one fused silica lens by mirrors, lenses, optical fibers, other means known in the art, or any combination thereof. Examples of such optical coupling with the lithographic device of WO 2006/045748 A3 are schematically shown in FIG. 6 and FIG. 7. Microlithography system 600 includes an excimer laser light source 610, an illumination system 620, and a projection system 630. A laser beam 612 travels from excimer laser light source 610 through illumination system 620 and projection system 630 along optical path 615. Illumination system 620 and projection system 630 each contain at least one fused silica lens (not shown) located in optical path 615. Projection system 630, for example, includes planar convex lens 632. In one embodiment, the infrared laser 660 is optically coupled with the at least one fused silica lens such that that the infrared laser beam 662 travels along optical path 615 through microlithography system 600 and irradiates the damaged region of the at least one fused silica lens. This may be accomplished using any combination of lenses 664, mirrors 666, and other optical components that are known in the art. Alternatively, the infrared laser 660 is optically coupled to the at least one fused silica lens by at least one optical fiber 668 that routes infrared laser beam 662 to optical path 615, as shown in FIG. 7. In another embodiment, optical fiber 668 may be used to route infrared laser beam 662 to the at least one fused silica lens by a path other than optical path 615.

The infrared laser has a frequency and power that enable it to repair radiation-induced damage using the method previously described herein. A non-limiting example of an infrared laser that is capable of repairing such radiation-induced damage is a titanium-sapphire optical parametric amplifier. The infrared laser may be tuned to the OH absorption band for silica, which occurs at a frequency in a range from about 3700 $cm^{-1}$ to about 3400 $cm^{-1}$. In one embodiment, the infrared laser may be tuned to a frequency (from about 3650 $cm^{-1}$ to about 3400 $cm^{-1}$) at which the absorption for fused silica exposed to DUV radiation is greater than that of fused silica that has not been exposed to DUV radiation. In a separate embodiment, the infrared laser has a frequency of about 3600 $cm^{-1}$.

The lithographic system allows the fused silica lenses to be repaired in situ; inclusion of the infrared laser in the system eliminates the need for major disassembly of the lithographic system and/or removal of the fused silica lenses.

The invention further provides a fused silica lens having a region in which radiation-induced damage has been repaired by irradiating the region with an infrared laser according to the methods described herein. In one embodiment, the damage in the fused silica lens is caused by DUV laser radiation. Repair of the region results in decreased wavefront distortion and PIB in the fused silica lens.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A lithographic system, the lithographic system comprising:
   a. a deep ultraviolet laser;
   b. at least one fused silica lens optically coupled to the deep ultraviolet laser, wherein the at least one fused silica lens is exposed to deep ultraviolet radiation produced by the deep ultraviolet laser; and
   c. a second radiation source optically coupled to the at least one fused silica lens along an optical path, wherein the radiation source provides localized heating to the at least one fused silica lens, and wherein the localized heating repairs radiation-induced damage caused by the deep ultraviolet radiation in the at least one fused silica lens.

2. The lithographic system according to claim 1, wherein the second radiation source is an infrared laser.

3. The lithographic system according to claim 2, wherein the infrared laser has a frequency in a range from about 3700 $cm^{-1}$ to about 3500 $cm^{-1}$.

4. The lithographic system according to claim 3, wherein the infrared laser has a frequency of about 3600 $cm^{-1}$.

5. The lithographic system according to claim 1, wherein the second radiation source is optically coupled to the at least one fused silica lens by at least one optical fiber.

6. A lithographic system, the lithographic system comprising:
   a. a deep ultraviolet laser;
   b. at least one fused silica lens optically coupled to the deep ultraviolet laser, wherein the at least one fused silica lens is exposed to deep ultraviolet radiation produced by the deep ultraviolet laser; and
   c. an infrared laser optically coupled to the at least one fused silica lens along an optical path, wherein the infrared laser is capable of providing localized heating to the at least one fused silica lens, and wherein the localized heating repairs radiation-induced damage caused by the deep ultraviolet radiation in the at least one fused silica lens.

7. The lithographic system according to claim 6, wherein the infrared laser has a frequency in a range from about 3700 $cm^{-1}$ to about 3500 $cm^{-1}$.

8. The lithographic system according to claim 6, wherein the infrared laser has a frequency of about 3600 $cm^{-1}$.

9. The lithographic system according to claim 6, wherein the at least one fused silica lens is disposed in an optical path.

10. The lithographic system according to claim 9, wherein the infrared laser is optically coupled to the at least one fused silica lens along the optical path.

11. The lithographic system according to claim 6, wherein the infrared laser is optically coupled to the at least one fused silica lens by at least one optical fiber.

12. The lithographic system according to claim 6, wherein repairing the radiation-induced damage decreases wavefront distortion and polarization-induced birefringence in the fused silica lens.

13. A method of repairing a fused silica article having radiation-induced damage, the method comprising the steps of:
   a. providing the fused silica article, the fused silica article having a damaged region, wherein the damaged region contains radiation-induced damage;
   b. optically coupling a radiation source optically coupled to the fused silica article along an optical path, wherein the radiation source is capable of providing localized heating to the fused silica article, and wherein the localized heating repairs the radiation-induced damage in the fused silica article; and
   c. irradiating the damaged region with the radiation source, wherein irradiating the damaged region locally heats the damaged region and repairs at least a portion of the radiation-induced damage.

14. The method according to claim 13, wherein the radiation source is an infrared laser.

15. The method according to claim 13, wherein the radiation-induced damage is caused by deep ultraviolet radiation.

16. The method according to claim 13, wherein the step of optically coupling the radiation source to the fused silica article comprises optically coupling the radiation source to the damaged area through an optical fiber.

17. The method according to claim 13, wherein the radiation source is an infrared laser having a frequency in a range from about 3700 $cm^{-1}$ to about 3500 $cm^{-1}$.

18. The method according to claim 17, wherein the infrared laser has a frequency of about 3600 $cm^{-1}$.

19. The method according to claim 13, wherein the step of irradiating the damaged region with the radiation source is carried out for a time period that is sufficient to reduce wavefront distortion and polarization-induced birefringence in the lens to a level or a value that is less than a predetermined level or a predetermined value.

20. The method according to claim 13, wherein the fused silica article is one of a lens, a prism, a filter, a photomask, a reflector, an etalon plate, and a window.

21. The method according to claim 20, wherein the fused silica article is a lens.

22. A method of reducing wavefront distortion and polarization-induced birefringence in at least one fused silica lens, the method comprising the steps of:
   a. providing the at least one fused silica lens, the fused silica lens having a damaged region having radiation-induced damage caused by deep ultraviolet laser radiation, and wherein the radiation-induced damage causes a wavefront distortion and polarization-induced birefringence in the fused silica lens;
   b. providing a radiation source optically coupled to the at least one fused silica lens along an optical path, wherein the radiation source is capable of providing localized heating to the at least one fused silica lens, and wherein the localized heating repairs radiation-induced damage caused by the deep ultraviolet radiation in the at least one fused silica lens; and
   c. irradiating the damaged region with the radiation source, wherein irradiating the damaged region locally heats the damaged region and repairs at least a portion of the radiation-induced damage, and wherein repairing at least a portion of the radiation-induced damage reduces the wavefront distortion and polarization birefringence in the fused silica lens.

23. The method according to claim 22, wherein the radiation source is an infrared laser.

24. The method according to claim 22, wherein the step of optically coupling the radiation source to the fused silica lens comprises optically coupling the radiation source to the damaged area through an optical fiber.

25. The method according to claim 22, wherein the radiation source is an infrared laser having a frequency in a range from about 3700 $cm^{-1}$ to about 3500 $cm^{-1}$.

26. The method according to claim 25, wherein the infrared laser has a frequency of about 3600 $cm^{-1}$.

27. The method according to claim 22, wherein the step of irradiating the damaged region with the radiation source is carried out for a time period that is sufficient to reduce wavefront distortion and polarization-induced birefringence in the fused silica lens to a level or a value that is less than a predetermined level or a predetermined value.

* * * * *